United States Patent [19]

Noguchi

[11] Patent Number: 5,424,803
[45] Date of Patent: Jun. 13, 1995

[54] PROJECTION EXPOSURE APPARATUS AND SEMICONDUCTOR DEVICE MANUFACTURING METHOD

[75] Inventor: Miyoko Noguchi, Tokyo, Japan

[73] Assignee: Canon Kabushiki Kaisha, Tokyo, Japan

[21] Appl. No.: 312,183

[22] Filed: Sep. 26, 1994

Related U.S. Application Data

[60] Continuation of Ser. No. 218,300, Mar. 28, 1994, abandoned, which is a continuation of Ser. No. 138,259, Oct. 20, 1993, abandoned, which is a division of Ser. No. 131,413, Oct. 4, 1993, abandoned, which is a continuation of Ser. No. 925,863, Aug. 7, 1992, abandoned.

[30] Foreign Application Priority Data

Aug. 9, 1991 [JP] Japan .................. 3-225223
Aug. 9, 1991 [JP] Japan .................. 3-225226

[51] Int. Cl.⁶ ................... G03B 27/42; G03B 27/72
[52] U.S. Cl. ........................... 355/53; 355/71
[58] Field of Search .......... 355/46, 53, 55, 67, 355/71; 356/399; 359/628; 362/18

[56] References Cited

U.S. PATENT DOCUMENTS

| | | | |
|---|---|---|---|
| 4,589,769 | 5/1986 | Matsuki | 355/71 |
| 4,739,373 | 4/1988 | Nishi et al. | 355/53 |
| 4,754,307 | 6/1988 | Bürki et al. | 355/46 |
| 4,814,829 | 3/1989 | Kosugi et al. | 355/43 |
| 4,851,882 | 7/1989 | Takahashi et al. | 355/46 |
| 4,939,630 | 7/1990 | Kikuchi et al. | 362/268 |
| 4,988,188 | 1/1991 | Ohta | 353/122 |
| 5,061,956 | 10/1991 | Takubo et al. | 355/55 |
| 5,121,160 | 6/1992 | Sano et al. | 355/53 |
| 5,144,362 | 9/1992 | Kamon et al. | 355/53 |
| 5,160,962 | 11/1992 | Miura et al. | 355/53 |
| 5,194,893 | 3/1993 | Nishi | 355/53 |
| 5,251,067 | 10/1993 | Kamon | 359/628 |
| 5,253,040 | 10/1993 | Kamon et al. | 356/399 |
| 5,262,822 | 11/1993 | Kosugi et al. | 355/53 |
| 5,264,898 | 11/1993 | Kamon et al. | 355/67 |
| 5,286,963 | 2/1994 | Torigoe | 355/53 X |
| 5,337,097 | 8/1994 | Suzuki et al. | 353/101 |

FOREIGN PATENT DOCUMENTS 4267515 9/1992 Japan .

*Primary Examiner*—Richard A. Wintercorn
*Attorney, Agent, or Firm*—Fitzpatrick, Cella, Harper & Scinto

[57] ABSTRACT

A projection exposure apparatus includes an illumination optical system for constituting illumination source for illuminating an original having an exposure pattern, the illumination optical system including changing mechanism for changing a shape of the illumination source; a projection optical system for projecting an image of the exposure pattern onto a surface to be exposed; an adjuster responsive to the changing mechanism to adjust the projection optical system.

41 Claims, 13 Drawing Sheets

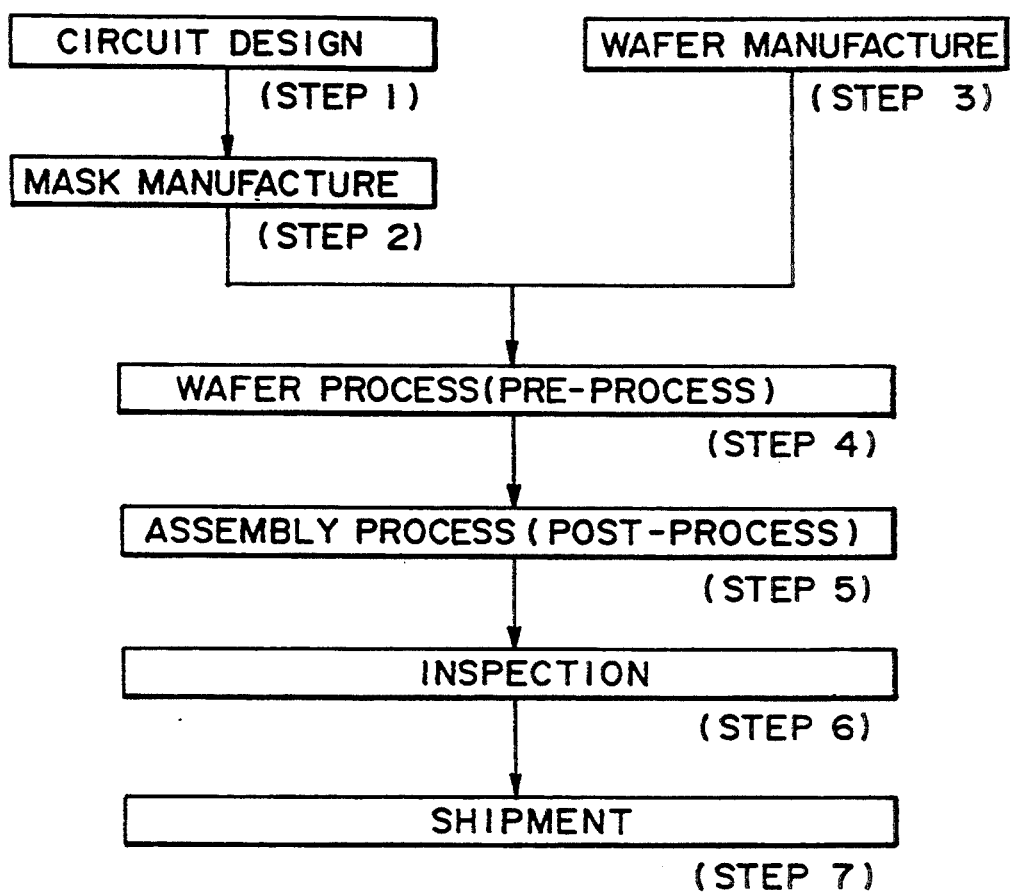
F I G. 13

PROJECTION EXPOSURE APPARATUS AND SEMICONDUCTOR DEVICE MANUFACTURING METHOD

This application is a continuation of application Ser. No. 08/218,300 filed Mar. 28, 1994, now abandoned, which is a continuation of application Ser. No. 08/138,259 filed Oct. 20, 1993, now abandoned, which is a divisional of application Ser. No. 08/131,413 filed Oct. 4, 1993, now abandoned, which is a continuation of application Ser. No. 07/925,863 filed Aug. 7, 1992, now abandoned.

FIELD OF THE INVENTION AND RELATED ART

The present invention relates to a projection exposure apparatus and a semiconductor device manufacturing method, more particularly to the apparatus and method in which even if a reticle pattern illumination method is changed, a high optical performance can be maintained.

The recent development in the semiconductor manufacturing device manufacturing techniques, and the development in the fine processing techniques, are remarkable. 1M DRAM semiconductor device requires the photoprocessing technique for sub-micron resolution. Heretofore, the resolution has been improved by means of increasing NA (numerical aperture) with a constant exposure light wavelengths. However, the recent developments include the change of the exposure light from g-line to i-line, using ultra high pressure mercury lamp. With the use of the g-line and i-line, the photoresist process has also been developed. Thus, the developments in the optical system and the photoresist system has been contributable to the developments in the photolithographic process.

It is generally known that the depth of focus of an exposure apparatus in the form of a stepper is reversely proportional to NA squared. Therefore, when the sub-micron resolution is provided, the depth of focus decreases correspondingly.

Japanese Patent Application No. 28631/1991 under the name of the assignee of this application has proposed a projection exposure apparatus having a higher resolution provided by the structure of illumination system depending on the pattern to be projected and the line width.

In order to maintain the satisfactory resolution, it is important that the optimum focus point of the projection optical system does not change. However, when the exposure light is applied to the projection optical system to project the pattern of the reticle onto the wafer, the projection optical system absorbs a part of the exposure light, with the result of heat generated in the projection optical system. If this occurs, the temperature of the lens material itself and the temperature between or around the lens materials, change, and therefore, the optical performance of the projection optical system changes. In other words, the optimum focus point of the projection optical system changes.

In the above-mentioned Japanese Patent Application, the illumination method is changed depending on the directions of the pattern of the reticle and the required line width, and the optical path in the projection optical system changes, accordingly. Then, the absorptions of the exposure beam in the projection optical system change, and the change in the optical system is different. For example, the ways of changes in the optimum focus point and the projection magnification, may be different.

SUMMARY OF THE INVENTION

Accordingly, it is a principal object of the present invention to provide a projection exposure apparatus and method in which the high optical performance is maintained even if the illumination method is changed.

It is a further object of the present invention to provide a semiconductor device manufacturing method in which the illumination method is selected in accordance with the nature of the circuit pattern, so that the semiconductor devices can be produced with high precision.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 13 is a flow chart showing semiconductor device manufacturing process steps.

DESCRIPTION OF THE PREFERRED EMBODIMENTS

Embodiment 1

Figure 1:
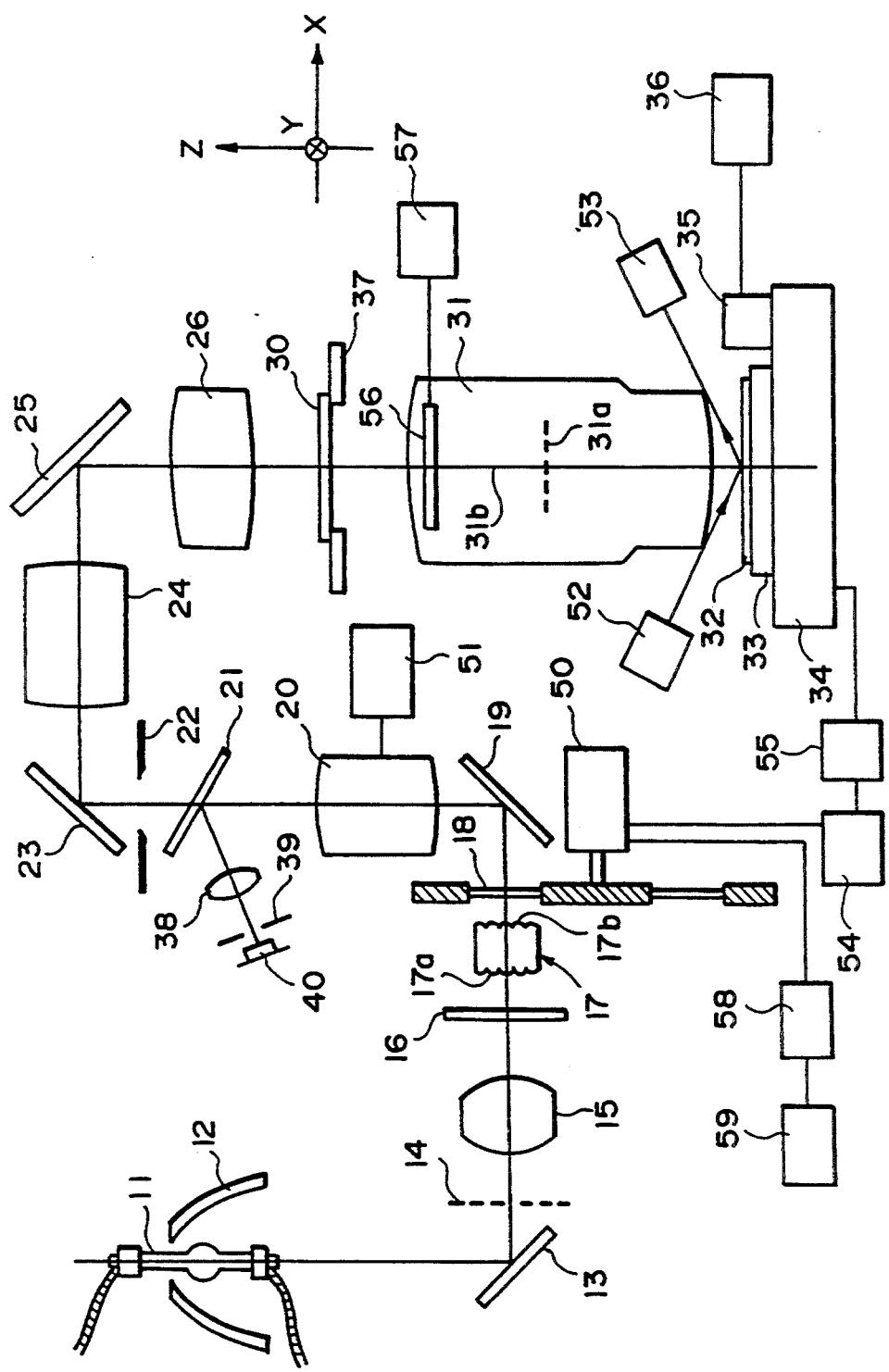
FIG. 1 is a systematic diagram of the projection exposure apparatus according to an embodiment of the present invention.

FIG. 1 is a schematic view of a projection exposure apparatus according to an embodiment of the present invention. Denoted at 11 is a light source (radiation source) comprising an ultra-high pressure Hg lamp, for example. The point of light emission of it is disposed adjacent to the first focal point of an elliptical mirror 12. The light produced by the lamp 11 is collected by the elliptical mirror 12. Denoted at 13 is a deflecting mirror, and denoted at 14 is a shutter for restricting the quantity of light to be passed. Denoted at 15 is a relay lens system for efficiently directing the light from the lamp 11 to an optical integrator 17 through a wavelength selecting filter 16. The optical integrator 17 comprises a plurality of small lenses arrayed two-dimensionally, to be described later.

In this embodiment, the manner of imaging to the optical integrator 17 may be either under critical illumination or under Koehler illumination. Also, the exit port of the elliptical mirror 12 may be imaged on the optical integrator 17. The filter 16 serves to select and pass only a desired wavelength component or components out of the light from the Hg lamp 11.

Denoted at 18 is a stop shape adjusting member (selecting means) comprising a turret having plural stops of different aperture shapes and sizes, disposed after the optical integrator. The stop shape adjusting member 18 operates to select predetermined ones of the small lenses of the optical integrator 17 in accordance with the shape of the optical integrator 17. That is, in this embodiment, the manner of illumination suitable to the configuration of a pattern of a semiconductor integrated circuit, concerned, is selected and the exposure process is executed in the selected manner of illumination. Details of selection of small lenses will be explained later.

Denoted at 19 is a mirror for deflecting the light path, and denoted at 20 is a lens system for collecting the light passing through the adjusting member 18. The lens system 20 plays an important role in providing uniformness of illumination. Denoted at 21 is a half mirror for dividing the light from the lens system 20 into reflected light and transmitted light. Of the divided lights, the light reflected by the half mirror 21 goes through a lens 38 and a pinhole 39 to a photodetector 40. The pinhole 39 is provided at a position which is optically equivalent to the reticle 30 having a pattern to be printed. The light passing through the pinhole 39 is detected by the photodetector 40, for controlling the amount of exposure.

Denoted at 22 is a mechanical blade called a masking blade, whose position can be adjusted by a driving system (not shown) in accordance with the size of the pattern region of the reticle 30 to be illuminated. Denoted at 34 is a mirror; at 24 is a lens system; at 25 is another mirror; and at 26 is another lens system. These elements serve to illuminate the reticle 30 planed on the reticle stage 37 wit the light from the Hg lamp 11.

A projection optical system 31 projects a focused pattern of the reticle 31 onto the wafer 32. The wafer 32 is attracted and supported on a wafer chuck 33, and the wafer chuck 33 is carried on a stage 34 controlled in response to a detection of a laser interferometer 36. A mirror 35 is placed on the wafer stage 34 and is effective to reflect the light from the laser interferometer 36.

Light projecting system 52 and a light receiving system 53 detect a surface level (in the direction of the optical axis 31b) of the wafer 32. The beam from the light projecting system 52 is formed as a spot on the wafer 32. The beam reflected by the wafer 32 is incident on a position sensor of the light receiving system 53, and an image of a light source is formed. In the surface level detecting position for the wafer 32, as shown in the Figure, the light reflection point on the wafer 32 surface and a light incident point on the position sensor of the light receiving optical system, are disposed in an imaging relation, so that the vertical positional deviation of the wafer 32 is detected on the basis of the light incident point on the position sensor.

In this embodiment, the light exit surface 17a of the optical integrator 17 is substantially in an optically conjugate relationship with a pupil plane 31a of the projection optical system 31 with the intervention of the elements denoted at 19, 20, 23, 24, 25 and 26. Namely, an effective light source image corresponding to the light exit surface 17b, is formed on the pupil plane 31a of the projection optical system 31.

Figure 2:
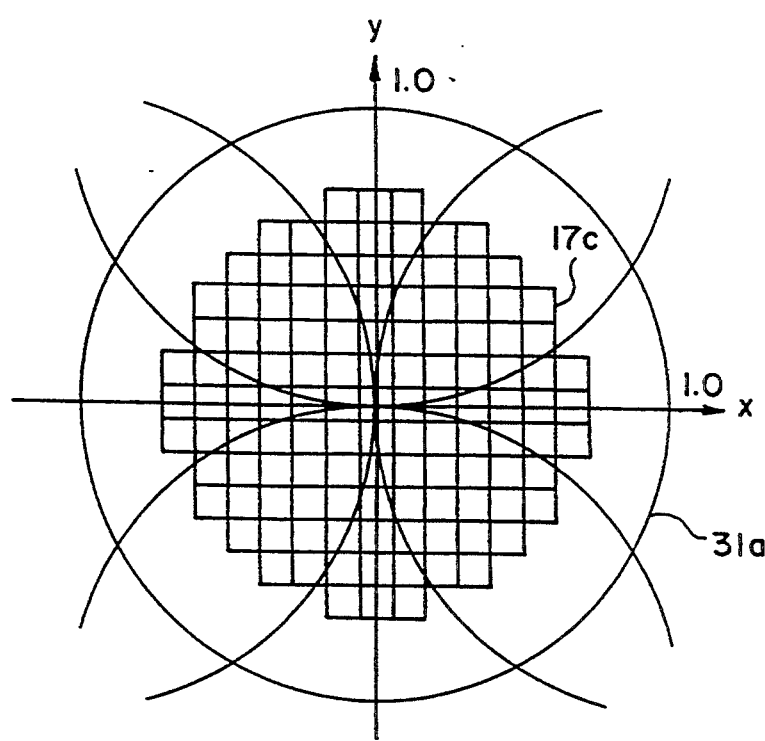
FIG. 2 illustrates a relationship between a pupil of a projection optical system and an optical integrator.

Referring now to FIG. 2, the relationship between the pupil plane 31a of the projection optical system 31 and the light exit surface 17a of the optical integrator 17 will be explained. The configuration of the optical integrator 17 corresponds to the configuration of the effective light source as formed on the pupil plane 31a of the projection optical system 31. This is shown in FIG. 2 wherein the shape of the effective light source image 17c on the light exit surface 17b as formed on the pupil plane 31a of the projection optical system 31 is illustrated superposedly. For standardization, the radius of the pupil 31a of the optical integrator 31 is taken as 1, and, within this pupil 31a, the small lenses of the optical integrator 17 are imaged to form the effective light source image 17c. In this embodiment, each small lens of the optical integrator has a square shape.

Here, orthogonal coordinates which define the major directions to be used in design of a semiconductor integrated circuit are taken on x and y axes. These directions correspond to the major directions of the pattern formed on the reticle 30, and they substantially correspond to the directions of the outside configuration (square shape) of the reticle 30.

Generally, if the wavelength is denoted by $\lambda$, the parameter is denoted by $k_1$ and the numerical aperture is denoted by NA, then the resolution RP can be given by:

$$RP = k_1 \cdot \lambda / NA$$

The case wherein a high resolution illumination system provides its power is a case where the $k_1$ factor takes a level about 0.5.

In the present embodiment, in consideration thereof, under the influence of a particular stop of the adjusting member 18, only the light that passes through selected ones of the small lenses of the optical integrator 17, selected in accordance with the shape of the pattern on the reticle 30 surface, is used to illuminate the reticle 30.

More specifically, selection of small lenses is such that the light is allowed to pass through plural zones on the pupil plane 31a of the projection optical system 31, other than the central zone thereof.

Figure 3A:
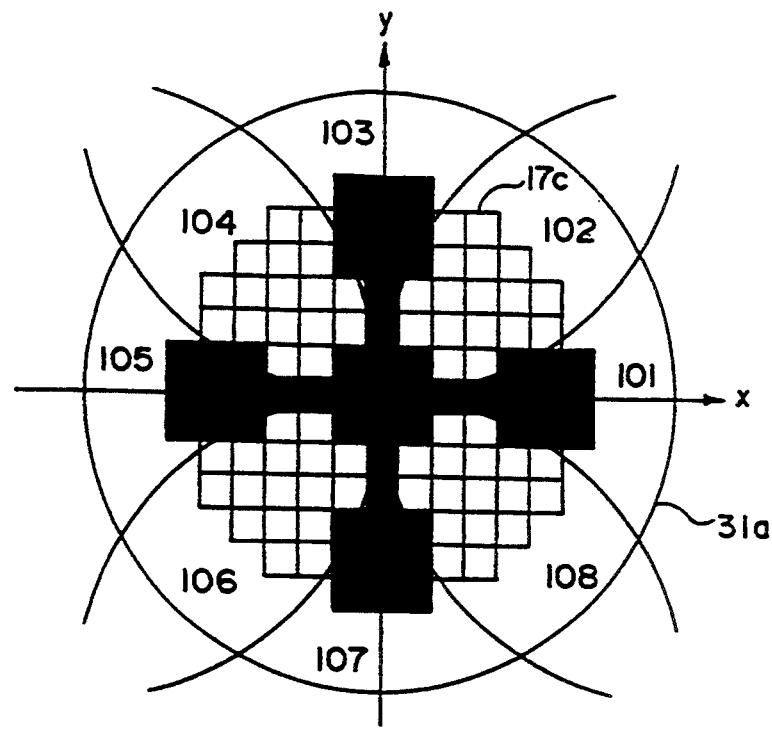
FIGS. 3A and 3B illustrate the pupil of the projection optical system.
Figure 3B:
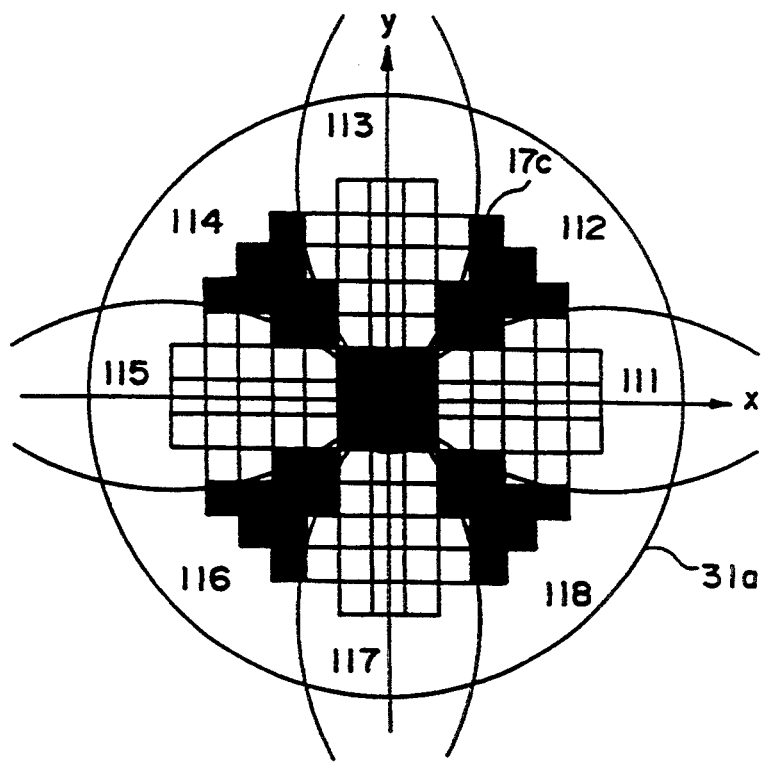

FIGS. 3A and 3B are schematic views each illustrating on the pupil plane 31a the manner of selection of light, passing through particular ones of the small leases of the optical integrator 17 selected by a particular stop of the adjusting member 18. In these drawings, the painted areas depict light-blocked regions. The blank areas depict those regions to which the light come.

More specifically, FIG. 3A illustrates an effective light source image upon the pupil plane 31a to be defined in an occasion where resolution is required with respect to x and y directions. Assuming the circle representing the pupil 31a as $x^2 + y^2 = 1$, the following four circles should now be considered:

$$(x-1)^2 + y^2 = 1$$

$$x^2 + (y-1)^2 = 1$$

$$(x+1)^2 + y^2 = 1$$

$$x^2 + (y+1)^2 = 1$$

With these four circles, the circle representing the pupil 31a is divided into eight zones 101–108.

The illumination system of high resolution and deep depth of focus with respect to the x and y directions, is accomplished in this embodiment by selected projection, with priority, of the light to small lens groups in such zones denoted by reference numerals of even number, that is, the zones 102, 104, 106 and 108. Since the small lenses adjacent to the origin (x=0, y=0) are mainly contributable to enlarging the depth with respect to a rough pattern, whether those at the central portion are to be selected or not is a matter of selection to be determined by the pattern to be printed.

In the example of FIG. 3A, those small lenses around the center are excluded. The portion outside the optical integrator 17 is light-blocked by an integrator holding member (not shown) within the illumination system. In FIGS. 3A and 3B, for easy understanding of the relationship between the small lenses to be light-blocked and the pupil 31a of the projection lens, the pupil 31a and the effective light source image 17c of the optical integrator are drawn in superposition.

On the other hand, FIG. 3B illustrates the configuration of a stop to be used in an occasion where high resolution is required with respect to patterns of ±45 deg. Similarly to the FIG. 4A case, there is illustrated the relationship between the pupil 31a and the effective light source image 17c of the optical integrator 17. For such ±45 deg. patterns, under the same conditions as in the preceding case, the following four circles are to be considered:

$$(x - 1/\sqrt{2})^2 + (y - 1/\sqrt{2})^2 = 1$$

$$(x + 1/\sqrt{2})^2 + (y - 1/\sqrt{2})^2 = 1$$

$$(x + 1/\sqrt{2})^2 + (y + 1/\sqrt{2})^2 = 1$$

$$(x - 1/\sqrt{2})^2 + (y - 1/\sqrt{2})^2 = 1$$

By drawing these four circles in superposition on the pupil 31a, like the FIG. 3A case, the pupil 31a is divided into eight zones 111–118. In this case, the zones which are contributable to enhancement of resolution to the ±45 deg. patterns are those zones denoted by reference numerals of odd number, that is, the zones 111, 113, 115 and 117. Thus, by selecting with priority those of the small lenses of the optical integrator 17 which present in these zones, to such ±45 deg. patterns the depth of focus is considerably enlarged at a $k_1$ factor of about 1.5.

Figure 4A:
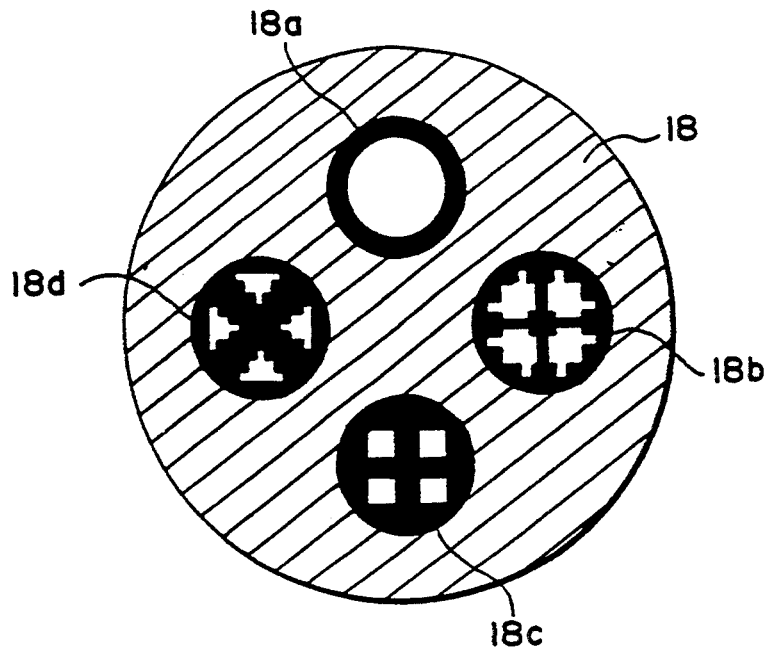
FIGS. 4A and 4B illustrate the aperture of the optical system.

FIG. 4A illustrates an example of the stop shape adjusting member 18. As illustrated, a turret type stop interchanging system is adopted in this embodiment. A first stop 18a it to be used in a case where a pattern which is not so fine ($k_1$ is not less than 1) is to be printed. The first stop 18a is of the same type as has been used in conventional illumination optical system, and it is a fixed stop and may be so set as to block the portion outside the small lenses of the optical integrator 17 as desired. Stops 18b–18d are selected in accordance with the type of a reticle pattern to be used.

In this embodiment, a secondary light source formed out of the optical system has independent light source portions in the four quadrants, respectively, of an orthogonal coordinates defined with the point of origin coincident with the optical axis, depending on the selection of the illumination system.

In this embodiment, a first original having a circuit pattern of relatively large minimum line width and a second original having a circuit pattern of relatively small minimum line width. When the first original is used, the secondary light source is formed adjacent to the optical axis as shown by an opening 18a in FIG. 4. When the second original is used, the secondary light sources are formed outside the optical axis as indicated by openings 18b, 18c and 18d in the same figure.

As for the configuration of the secondary light source outside the optical axis, it may be in the form of a circular ring-like or rectangular ring-like shape.

Generally, in an illumination system for providing a high resolution, for a higher spatial frequency it is advantageous to use an outside region, upon the pupil plane, beyond the size of the optical integrator 17 as required in conventional illumination systems. For example, while it may be preferable in a conventional illumination system to use small lenses within a radius of 0.5, in an illumination system for high resolution it may be preferable to use those small lenses in a circle of a maximum radius of 0.75 although the small lenses in the central portion are not used.

In consideration of this, it is desirable to set the size of the optical integrator 17 as well as the effective diameter of the illumination system and the like while taking into account both the conventional type and the high resolution type. Further, it is desirable that the light intensity distribution at the light entrance end 17a of the optical integrator 17 has a sufficient size so that it can function well even if a stop member is inserted. The possibility of blocking outside small lenses by the stop 18a is for the reason described above. It may be possible that, while an optical integrator 17 prepared is provided with a radius up to 0.75, the stop 18a serves to select a portion within a radius 0.5.

Figure 4B:
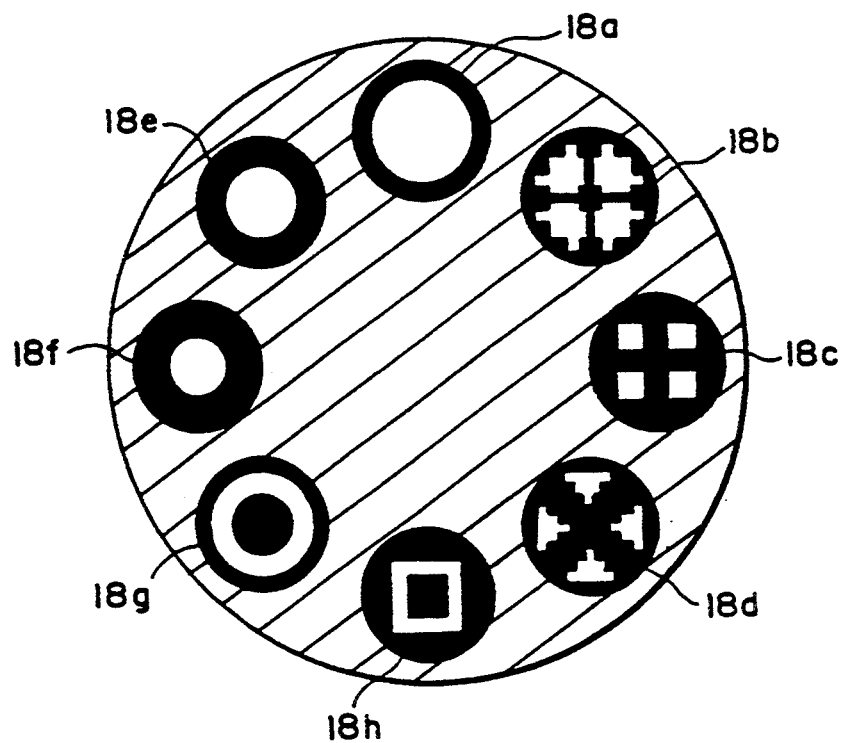

In this manner, the stop shape may be determined while taking into account the specificness of a pattern of a semiconductor integrated circuit to be manufactured and, by doing so, it is possible to provide an exposure apparatus best suited to the pattern. The selection of stops may be executed automatically under the influence of a control computer which may be provided to control the operation as a whole of the exposure apparatus. What is illustrated in FIG. 4A is an example of stop shape adjusting member formed with such stops and, in this example, a desired one of four types of stops 18a–18d can be selected. As a matter of course, the number of stops may be easily increased as desired. An example is illustrated in FIG. 4B. In this example, stops 18a–18d are of the same structure as the those of FIG. 4A example. Stop 18e has an opening of a size smaller than the stop 18a. Stop 18f has an opening of further reduced size. Stop 18g has a ring-like opening having a central light blocking portion. Stop 18h has a rectangular ring-like opening.

There is a possibility that, when a stop is selected, the non-uniformness of illuminance changes with the selection of stop. In this embodiment, in consideration thereof, the non-uniformness of illuminance in that occasion may be adjusted by using the lens system 20. The non-uniformness of illuminance can be adjusted finely by adjusting the spacing or spacings of lens elements of the lens system 20 in the direction of its optical axis. Denoted at 51 is a driving mechanism for moving a or some lens elements of the lens system 20. The adjustment of the lens system 20 may be made in response to the selection of a stop. If desired, it may be possible to replace the lens system 20 itself by a different one in accordance with the stop shape adjustment. In that occasion, plural lens systems 20 may be prepared and may be interchangeably used in a turret fashion in response to the selection of a stop shape.

In this embodiment, as described, by changing the shape of stop, an illumination system suitable to the characteristic of a pattern of a semiconductor integrated circuit is selected. Another feature of this embodiment resides in that, when an illumination system for high resolution is selected, the formed effective light source comprise four separate zones. What is important in this case is the balance of intensity of these four zones. In the arrangement of FIG. 1, however, there is a possibility that the shadow of a cable to the Hg lamp 11 adversely affects the balance. In order to avoid this, it is preferable in the illumination system for high resolution which uses the stop means shown in FIG. 4 to connect the cable so that the linear shadow of the cable comes to the position of the small lenses of the optical integrator as light-blocked by the stop.

Figure 5:
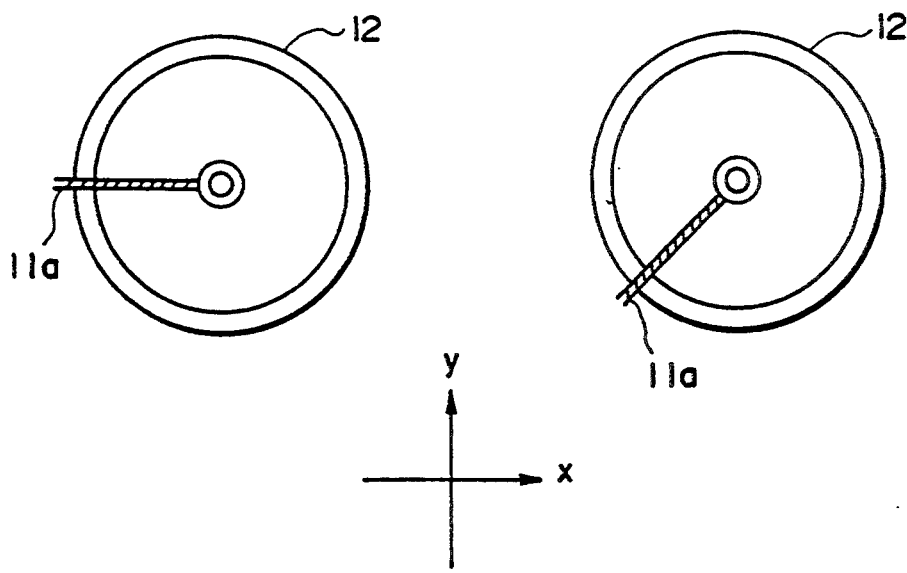
FIG. 5 shows a cable extending from an ultra high pressure mercury lamp.

Namely, in the example of FIG. 3A, it is preferable that the cable 11a is stretched in the x or y direction as illustrated in FIG. 5A. When the stop of FIG. 3B is used, it is preferable to that the cable 11a is stretched in a direction of ±45 deg. relative to the x or y direction as illustrated in FIG. 5B. In this embodiment, the direction of stretching the cable may be changed in accordance with the change of the shape of stop.

The description will be described as to the compensating method for optical characteristics changes occurs in the projection optical system, for example, a temperature change due to absorption of a part of exposure light energy.

When $\Delta F_1$ and $\Delta F_2$ are differences of focus change amount between non-exposure period and exposure period, at a time t, the following results:

$$\Delta F_1 = I_o \cdot \exp\{-k_2 \cdot t\}$$

$$\Delta F_2 = I_o \cdot \{1 - \exp(-k_1 \cdot t)\}$$

Where $I_o$ is proportional to the absorbed energy, and $k_1$ and $k_2$ are thermal conductivity coefficient. The difference relating to the magnification change $\Delta \beta_1$ and $\Delta \beta_2$, the equations include substantially the same parameters.

Figure 6:
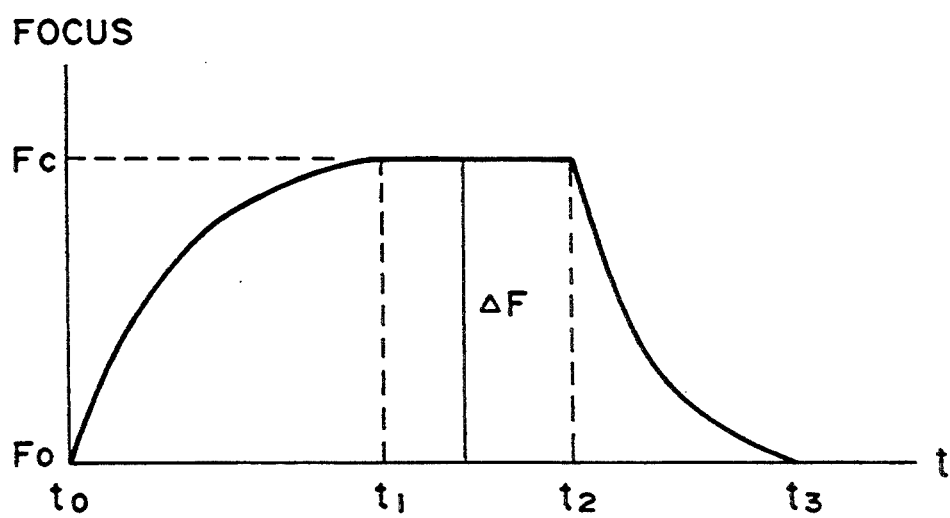
FIG. 6 illustrates a variation of a focus point of a projection optical system when it absorbs a part of the exposure light energy.

Here, coefficient $I_o$, $k_1$ and $k_2$ are called focus change coefficient. It is assumed that the initial optimum focusing surface (focusing position) of the projection optical system is $F_0$ and the exposure beam is applied to the projection optical system from the point of time $t_0$. Then, as shown in FIG. 6, the optimum focus surface changes with time until it is stabilized at a position $F_C$ at time $t_1$. The position $F_C$ is a saturation point corresponding to the incident energy.

When the exposure light application is stopped at time $t_2$, the optimum focusing surface returns in an exponential function fashion with time from the position $F_C$ to the initial position $F_0$ (time $t_3$). Thus, the change amount $\Delta F$ from the initial level $F_0$ to the saturated level $F_C$ changes proportionally to the illumination energy (the transmittance of the reticle and the illumination strength). The time constant $T_1$ in the rising profile from time $t_0$ to time $t_1$, and the time constant $T_2$ of the falling profile from the time $t_2$ to the time $t_3$, are peculiar to the projection optical system.

Among the change amount $\Delta F$, the time constants $T_1$ and $T_2$, the focus change coefficients $I_o$, $K_1$ and $K_2$, satisfy the following:

$$\Delta F = \Delta I = I_o = I_o \cdot \tau \times E$$

$$T_1 = 1/K_1$$

$$T_2 = 1/K_2$$

Where $\tau$ is a transmittance of the reticle, E is illumination light quantity per unit time. The parameters $I_o$, $K_1$ and $K_2$ are different if the conditions of the light rays passing through the projection optical system, that is, the illumination method. The parameters $\tau$ and E can be predetermined based on measurements. The following calculations can be carried out on the basis of measurements of the opening and closing periods of the shutter 14 of the apparatus.

In view of the above, the optimum focus surface position is calculated using optimum parameters $I_o$, $K_1$ and $K_2$ which are different depending on illumination method even when the same projection optical system is used.

Figure 7A:
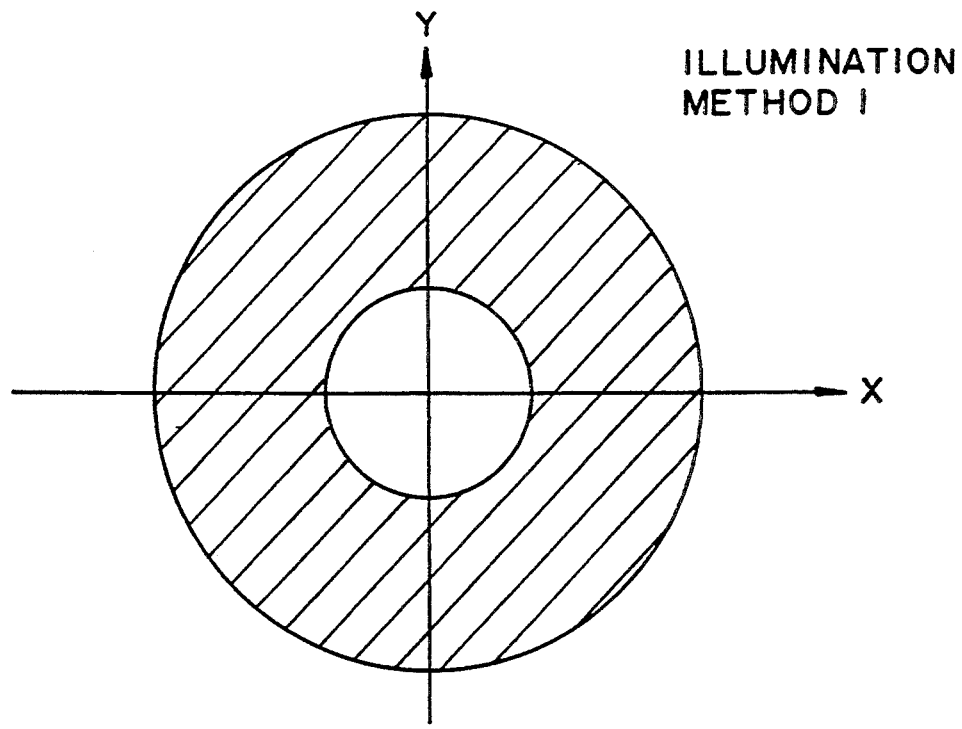
FIGS. 7(A–B) illustrate a pupil of another projection optical system.
Figure 7B:
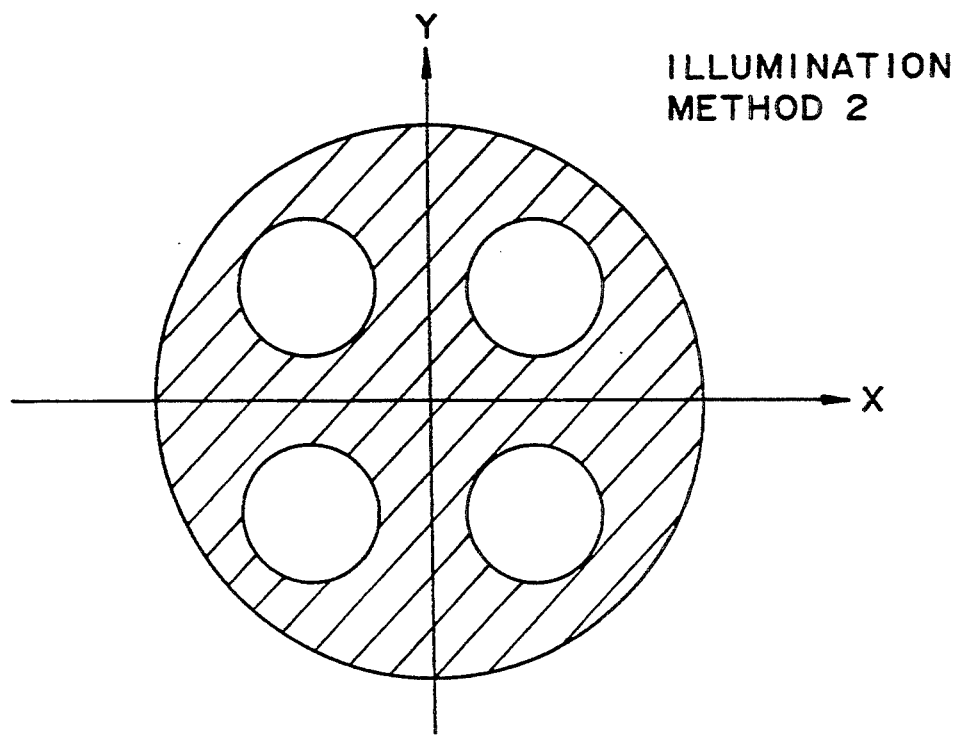

Table 1 shows the parameters $I_o$, $K_1$ and $K_2$ used by the calculating means upon the correction of the optical performance in the projection optical system 31 when the illumination methods 1 and 2 having the strength distribution on the pupil shown in FIGS. 7A and 7B, are shown.

TABLE 1

| Parameter | Illumination Method | |
|---|---|---|
| | 1 | 2 |
| $I_o$ (μm) | 1.2 | 1.1 |
| $K_1$ (/min) | 0.2 | 0.15 |
| $K_2$ (/min) | 0.2 | 0.15 |

In this embodiment, the parameters are properly selected on the basis of the difference of the illumination method, so that the optical performance change at the time of the temperature change of the projection optical system attributable to the ejection light energy absorption, is corrected in precision, thus permitting high accuracy projection exposure.

The description will be made as to the correction method on the basis of the results of calculations from the calculating means 54 of FIG. 1. In this embodiment, the calculating means 54 detects the illumination method or mode for the reticle 30 on the basis of the signal from the driving means 50 for driving the aperture shape adjusting member 18. The calculating means 54 selects the focus coefficients $I_o$, $K_1$, $K_2$, the time constants $T_1$, $T_2$ and the like which are most appropriate to the illumination method. Among various parameters, at least one parameter is changed, and the change in the variation of the focus point and the projection magnification and another optical performance of the projection optical system 31, are calculated.

When the variation in the focus point, for example, is corrected, the driving means 54 drives the stage 34 in the direction of the optical axis 31b on the basis of the signal from the calculating means 54.

When the magnification change is to be corrected, that lens 56 of the projection optical system 31 which is closer to the reticle 30 is moved in the direction of the optical axis by the driving means 57, so that the wafer 32 position is substantially assured at all times at the optimum focusing point of the projection optical system from the start of the projection exposure of the wafer to the end thereof, and the constant projection magnification is maintained. When the change of the projection magnification is to be corrected, the reticle 30, for example, is moved in the direction of the optical axis of the projection optical system 31. It is possible that a lens other than the lens 56 in the projection optical system 31 may be moved in the direction of the optical axis.

In order to position the wafer 32 surface at the optimum focusing level of the projection optical system 31, the projection optical system 30 may be moved along the optical axis, or a pressure of a chamber which is hermetically formed between lens elements constituting the projection optical system 31 may be controlled.

Figure 8:
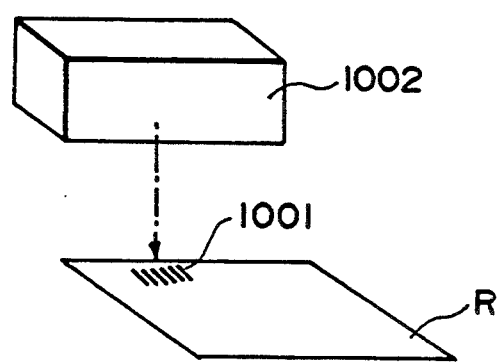
FIG. 8 illustrates reading of bar code on a reticle surface.

As shown in FIG. 8, in this embodiment, a bar code 1001 formed on a part of the reticle R is read by a bar code reader (input means 59 of FIG. 1) 1002, so that the information relating to the nature of the pattern or the lines on the reticle, are detected. The information is transmitted to a controller 58. As another method, the pattern information may be manually supplied to the controller 58 by input means 59 in a console or the like. The controller 58 discriminates the strength distribution of the secondary light source on the basis of the pattern information from the input means 59. Then, the driving means 50 is controlled accordingly so as to provide the strength distribution shown in FIGS. 3A and 3B.

In this embodiment, when various illumination methods or modes are used on the basis of selection for the purpose of optimum high resolution projection exposure by selection of the illumination systems matching the respective patterns in consideration of the line width and directions of the pattern on the reticle, the calculation equations are properly selected in accordance with the selected illumination modes to determine the changes of the optical performance of the projection optical system including the focus point change, the projection magnification change or the like. In this manner, the changes can be properly compensated so as to maintain the high resolution at all times, in the semiconductor device manufacturing method, and a projection exposure apparatus using the same.

Embodiment 2

The description will be made as to the projection exposure apparatus according to a second embodiment of the present invention. In the first embodiment, the parameters used in calculation for the optical performance of the projection optical system are changed in accordance with the change in the illumination mode. In the present embodiment, various elements of the projection optical system are adjusted in accordance with the change of the illumination mode.

Figure 9:
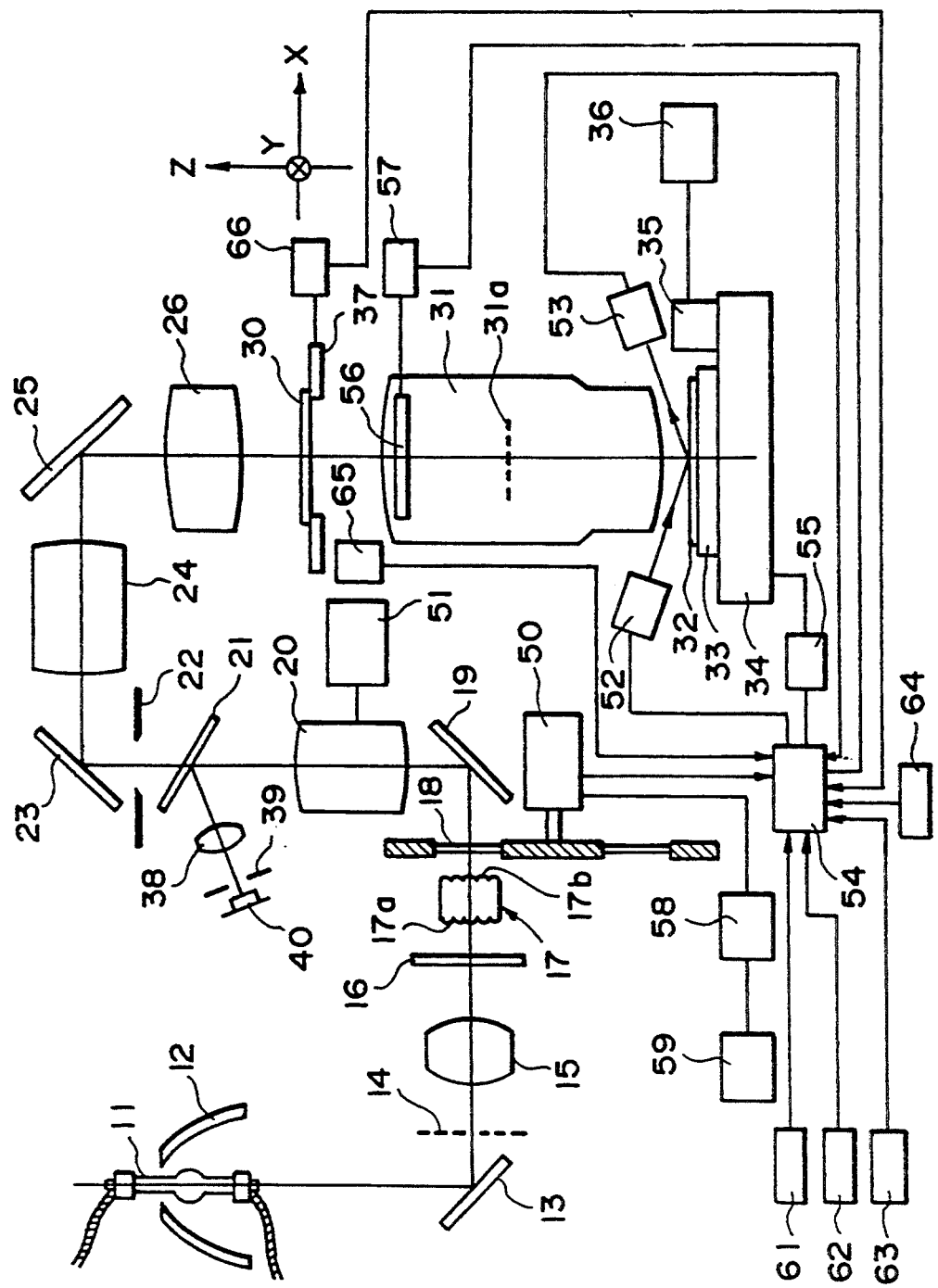
FIG. 9 is a system diagram of an apparatus according to a second embodiment of the present invention.

FIG. 9 shows the structure of the apparatus of this embodiment. It is similar to that of the first embodiment, and therefore, the same reference numerals as in FIG. 1 have been assigned to the elements having the corresponding functions, and the detailed description thereof are omitted. In FIG. 9, designated by reference numeral 61 is a pressure sensor; 62, a temperature sensor; 63, a moisture sensor; 64, a temperature sensor; 65, a reticle position detecting means for detecting the position of the reticle; and 66, driving means for changing the position of the reticle 30.

The description will be made as to the method in which at least one of the optical performances of the projection optical system such as distortion or the magnification change difference, in the illumination method of the illumination system. In this embodiment, the optical performance adjustment of the projection optical system 31 is mainly controlled by a controller 54 having a microprocessor. An example of the controller 54 have the following function.

(a) The illumination mode for the reticle 30 is detected on the basis of the signal from the driving means 50 for driving the aperture shape adjusting member 18;

(b) On the basis of detection of the illumination mode, the optical system change such as distortion or the magnification error change of the projection optical system 31 is calculated in the manner which will be described. The change in the optical performance of the projection optical system such as distortion or the magnification error or the like at this time is adjusted by moving that lens 56 of the projection optical system 31 closer to the reticle 30 by the driving means 57 along the optical axis, or by changing the position of the reticle 30 by the driving means in accordance with a signal from a reticle position detecting means 65; and (c) On the basis of the signals from the ambient pressure sensor 61, the temperature sensor 62 and the humidity sensor 63 and the signal from the lens temperature sensor 64, the focus position change of the projection optical system 31 and the magnification change or the like, are calculated on the basis of the equations and coefficients or the like memorized beforehand. The amount of change at this time is used to move the stage 34 along the optical axis 31b by driving means 55, for example.

The description will be made as to a specific example of adjusting method for the optical performance when the projection optical system having the data shown in Table 2.

TABLE 2

| | | |
|---|---|---|
| R1 = 223.62 | D1 = 15.00 | N1 = 1.52113 |
| R2 = −3002.34 | D2 = 198.58 | |
| R3 = 447.09 | D3 = 8.00 | N2 = 1.52113 |
| R4 = 120.41 | D4 = 6.85 | |
| R5 = 1361.15 | D5 = 8.00 | N3 = 1.52113 |
| R6 = 116.03 | D6 = 60.00 | |
| R7 = 233.10 | D7 = 24.00 | N4 = 1.52113 |
| R8 = −194.78 | D8 = 1.00 | |
| R9 = 183.54 | D9 = 20.00 | N5 = 1.52113 |
| R10 = −539.45 | D10 = 30.00 | |
| R11 = 68.35 | D11 = 27.00 | N6 = 1.52113 |
| R12 = 49.48 | D12 = 55.00 | |
| R13 = −74.38 | D13 = 12.00 | N7 = 1.52113 |
| R14 = 121.20 | D14 = 30.00 | |
| R15 = −36.94 | D15 = 20.00 | N8 = 1.52113 |
| R16 = −53.05 | D16 = 1.00 | |
| R17 = −664.38 | D17 = 18.00 | N9 = 1.52113 |
| R18 = −89.10 | D18 = 1.00 | |
| R19 = 358.30 | D19 = 16.50 | N10 = 1.52113 |
| R20 = −215.20 | D20 = 1.00 | |
| R21 = 122.34 | D21 = 18.50 | N11 = 1.52113 |
| R22 = 608.00 | D22 = 1.00 | |
| R23 = 68.11 | D23 = 20.00 | N12 = 1.52113 |
| R24 = 103.07 | D24 = 73.14 | |

In Table 2, Ri is a radius of curvature of i-th lens surface as counted from the reticle side; Di is a thickness of i-th lens or air space; and Ni is a refraction index of the material of i-th lens.

Figure 11:
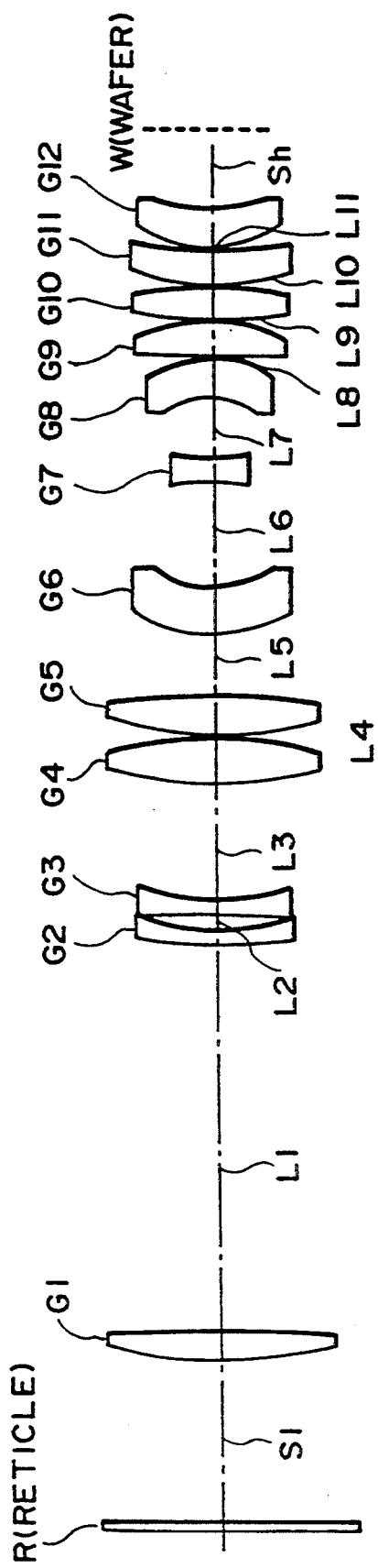
FIG. 11 shows a lens arrangement of a projection optical system according to an embodiment of the present invention.

FIG. 11 is a longitudinal sectional view of a projection optical system of Table 2.

Table 3 give a change (ΔSD) of a symmetrical distortion at a position 10 mm away from the wafer 2 surface, a projection magnification change (ΔS), a ratio therebetween (ΔSD/Δβ), an image height change (Δy), a one side blurness change ΔΔy and pivotal inclination change ΔP, when the distance S1 between the reticle 30 and the projection optical system 31, the distance between lenses L1–L13, independently by 1 mm.

TABLE 3

|   | Symmetrical distortion ΔSD (μm) | Magnification error Δβ (μm) | ΔSD/Δβ |
|---|---|---|---|
| S1 | 0.77 | 0 | ∞ |
| L1 | 1.08 | −20 | 0.054 |
| L2 | 1.03 | −15 | 0.068 |
| L3 | 4.40 | 20 | 0.22 |
| L4 | −0.33 | −10 | 0.033 |
| L5 | −0.32 | 45 | 0.007 |
| L6 | 0.19 | 35 | 0.005 |
| L7 | −0.24 | −75 | 0.003 |
| L8 | 0.58 | −90 | 0.006 |
| L9 | −0.67 | −10 | 0.067 |
| L10 | −0.39 | 20 | 0.020 |
| L11 | 0.20 | 20 | 0.01 |
| L12 | 0 | 0 | 0 |

TABLE 3

|   | Field curvature ΔY (μm) | Pivotal inclination ΔP | One-side blurness ΔΔy |
|---|---|---|---|
| S1 | −0.1 | 0.18 | −0.02 |
| L1 | −0.1 | 0.12 | −0.19 |
| L2 | 4.1 | −0.05 | 0.30 |
| L3 | −22.7 | −1.71 | 7.01 |
| L4 | 4.2 | 0.02 | 0.27 |
| L5 | 7.6 | −0.50 | −2.09 |
| L6 | 5.1 | 0.17 | −0.77 |
| L7 | 21.2 | −4.54 | 1.86 |
| L8 | 38.1 | −10.23 | 0.13 |
| L9 | 8.7 | 0.44 | 0.97 |
| L10 | 8.1 | 0.26 | −0.24 |
| L11 | 11.8 | −0.37 | 0.72 |
| L12 | 0 | 0 | 0 |

In this embodiment, the change in the optical performance at the time when the between lens distance is changed is predetermined, and the optical performance change of the projection optical system in response to the difference in the illumination mode, is adjusted.

Figure 10A:
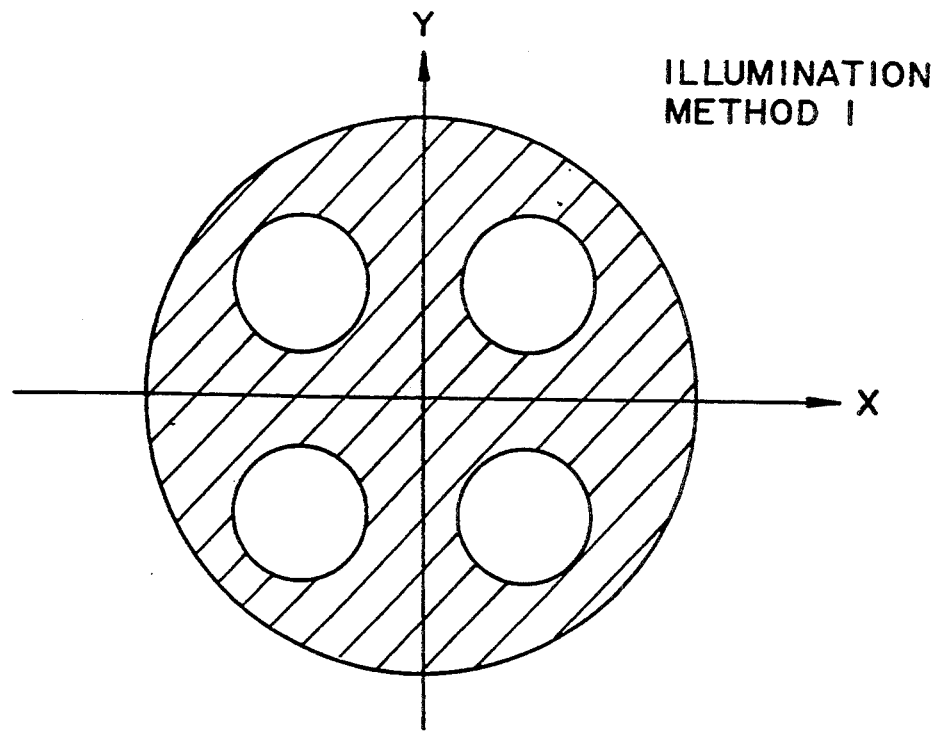
FIGS. 10(A–B) illustrate a pupil of a projection optical system of another illumination method.
Figure 10B:
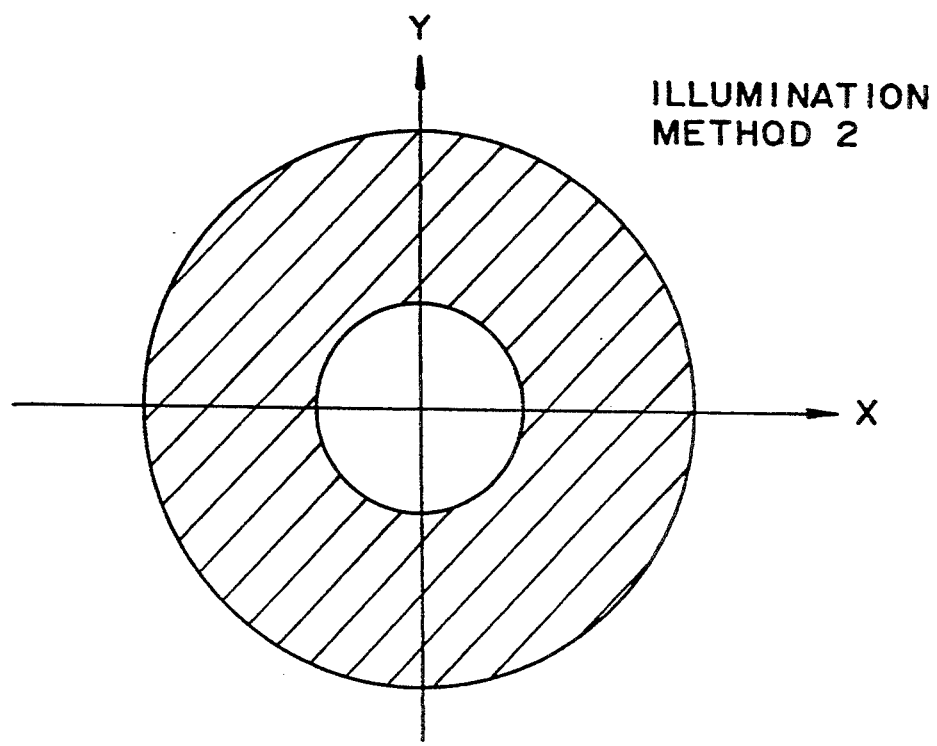

The description will be made as a specific example of optical performance adjusting method. Two illumination methods or modes are taken. In one of them, as shown in FIG. 10A, independent light portions are located at the respective quandaries of the orthogonal coordinates, and in the other, the light source portion is only at the neighborhood of the optical axis as in the conventional system. The first system is named illumination mode 1, and the second is named as illumination mode 2.

The magnification error, the distortion error and the field of curvature of the projection optical system change depending on the illumination mode, as shown in Table 4. The data are at a position of 10 mm image height on the wafer surface.

TABLE 4

|   | Q Illumination method 1 (μm) | N Illumination method 2 (μm) |
|---|---|---|
| Mag. Error | −0.5 | −0.3 |
| distortion | −0.3 | 0.0 |
| Field curvature | 9.0 | 8.0 |

Using Table 3 data, the magnification error, the distortion error, the field of curvature, the one side blurness and the pivotal inclination, are corrected.

The distortion error ΔSD, the magnification error ΔB, the field of curvature ΔY, the one side blurness ΔΔy and the pivotal inclination ΔB, are expressed with change ΔS1 of the interval S1, the change ΔL1 of the interval L1, the change ΔL3 of the interval L3, the change ΔL5 of the interval L5 and the change ΔL8 of the interval L8.

$$\Delta SD = 0.77 \times \Delta S1 + 1.08 \times \Delta L1 + 4.40 \times \Delta L3 -$$
$$0.32 \times \Delta L5 + 0.58 \times \Delta L8$$

$$\Delta B = -20.0 \times \Delta L1 + 20.0 \times \Delta L3 +$$
$$45.0 \times \Delta L5 - 90.0 \times \Delta L8$$

$$\Delta Y = -0.10 \times \Delta S1 - 0.10 \times \Delta L1 - 22.7 \times \Delta L3 +$$
$$7.60 \times \Delta L5 + 38.1 \times \Delta L8$$

$$\Delta P = 0.18 \times \Delta S1 + 0.12 \times \Delta L1 - 1.71 \times \Delta L3 -$$
$$0.50 \times \Delta L5 - 10.2 \times \Delta L8$$

$$\Delta Sd = -0.02 \times \Delta S1 - 0.19 \times \Delta L1 + 7.01 \times \Delta L3 -$$
$$2.09 \times \Delta L5 + 0.13 \times \Delta L8$$

The case of the change from illumination mode 1 to the illumination mode 2, will be dealt with.

In order to nullify the one side blurness ΔΔy and the pivotal inclination change ΔP (=0) so as to correct the various differences in the above Table, the distortion error ΔSD, the magnification error ΔB and the field of curvature ΔY', the solution is obtained with unknown values ΔS1, ΔL1, ΔL3, ΔL5 and ΔL8, by the following equations:

$$\Delta SD = -0.77 \times \Delta S1 + 1.08 \times \Delta L1 + 4.40 \times \Delta L3 -$$
$$0.32 \times \Delta L5 + 0.58 \times \Delta L8 = 0.2$$

$$\Delta B = -20.0 \times \Delta L1 + 20.0 \times \Delta L3 +$$
$$45.0 \times \Delta L5 - 90.0 \times \Delta L8 = 0.3$$

$$\Delta Y = -0.10 \times \Delta S1 - 0.10 \times \Delta L1 - 22.7 \times \Delta L3 +$$
$$7.60 \times \Delta L5 + 38.1 \times \Delta L8 = 1.0$$

$$\Delta P = 0.18 \times \Delta S1 + 0.12 \times \Delta L1 - 1.71 \times \Delta L3 -$$
$$0.50 \times \Delta L5 - 10.2 \times \Delta L8 = 0.0$$

$$\Delta Sd = -0.02 \times \Delta S1 - 0.19 \times \Delta L1 + 7.01 \times \Delta L3 -$$
$$2.09 \times \Delta L5 + 0.13 \times \Delta L8 = 0.0$$

If they are not completely solved, the closest values are obtained for the distortion error ΔSD, the magnification error ΔB, the field of curvature ΔY, the pivotal inclination ΔP and the one side blurness ΔΔy.

In order to correct the five values, five unknown values, i.e., five lens intervals, are not always required. One or more or more than five of the lens intervals may be used.

The distortion error, the magnification error, the field of curvature, the pivotal inclination and the one side blurness, which change with time due to the ambient condition such as pressure or temperature or due to the absorption of the exposure energy, may be corrected by adjusting at least one lens interval in the similar manner, if the changes with time are measured, or they are calculated beforehand.

The description will be made as to the case in which the symmetrical distortion error, the projection magnification error, for example, are adjusted with correction depending on the illumination mode.

In this embodiment, the optical performance change with time due to the ambient condition change, is taken into consideration. When the change of the interval S1 is ΔS1, and the change of the interval L1 is ΔL1, the change ΔSD and ΔB of the symmetric distortion and the projection magnification, are as follows from the data of Table 2:

$$\Delta SD = 0.77 \times \Delta S1 + 1.08 \times \Delta L1$$
$$\Delta \beta = -20 \times \Delta L1$$

If the correction targets of the symmetric distortion and the projection magnification, are given, ΔL1 and ΔS1, are given by the following:

$$\Delta S1 = k_1 \times (20 \times \Delta SD + 1.08 \times \Delta \beta)$$
$$\Delta L1 = (1/20) \times \Delta \beta$$

where $k_1 = (15.4)^{-1}$

In this embodiment, using the above-values, the projection magnification error and the symmetric distortion error which are most greatly influenced among the distortion errors due to the ambient condition change such as pressure or temperature change, are properly corrected.

The change in the aberration due to the change in the distance between the projection optical system and the object surface (reticle), that is, interval S1 is usually small as compared with the change in the near-axis factors such as projection magnification and focus point. As compared with the air interval between lenses in the projection optical system, the ratio of the change in the aberration to the change in the near-axis factor, is small. This is because the inclination of a light ray in the projection optical axis is usually large as compared with the inclination of the light ray between the object surface and the projection optical system, and therefore, when the air interval changes, the incidence height of the beam on the refracting surface is large with the result of large aberration change.

In consideration of the above, in this embodiment, the projection magnification correction is mainly performed by adjusting the interval S1 by moving the reticle 30 by the driving means 66, and the symmetrical distortion error correction is carried out by moving the lens 56 in the projection optical system, so that both of the projection magnification error and the symmetric distortion error, are simultaneously corrected in good order. Particularly, the selection of the air thickness with which the distortion change is small except for the symmetric distortion, all of the optical performances are maintained in good order.

In the case of the projection optical system 31 being telecentric at both sides, a lens for accomplishing the telecentric property at the object side is used, and this is called field lens. In the case of the telecentric property at both sides, the changes in the aberrations other than the magnification and the symmetric distortion are very small even if the distance between the reticle and the lens is changed, but the symmetric distortion changes. When the field lens is changed, the magnification and the symmetric distortion can be changed without substantial influence to the other aberrations. In view of this, in this embodiment, the distortion error is changed by moving the reticle-lens distance and the field lens without deteriorating the image performance.

In the foregoing embodiment, the change in the optical performance resulting from the using mode of the projection optical system due to the optical path change of the projection optical system when the optimum high resolution projection exposure is effected by properly selecting the illumination system in consideration of the line width and direction of the pattern of the reticle, is adjusted in the manner described above, and therefore, a semiconductor device manufacturing method and a projection exposure apparatus using same can be provided with high resolution maintained at all times.

Embodiment 3

Figure 12:
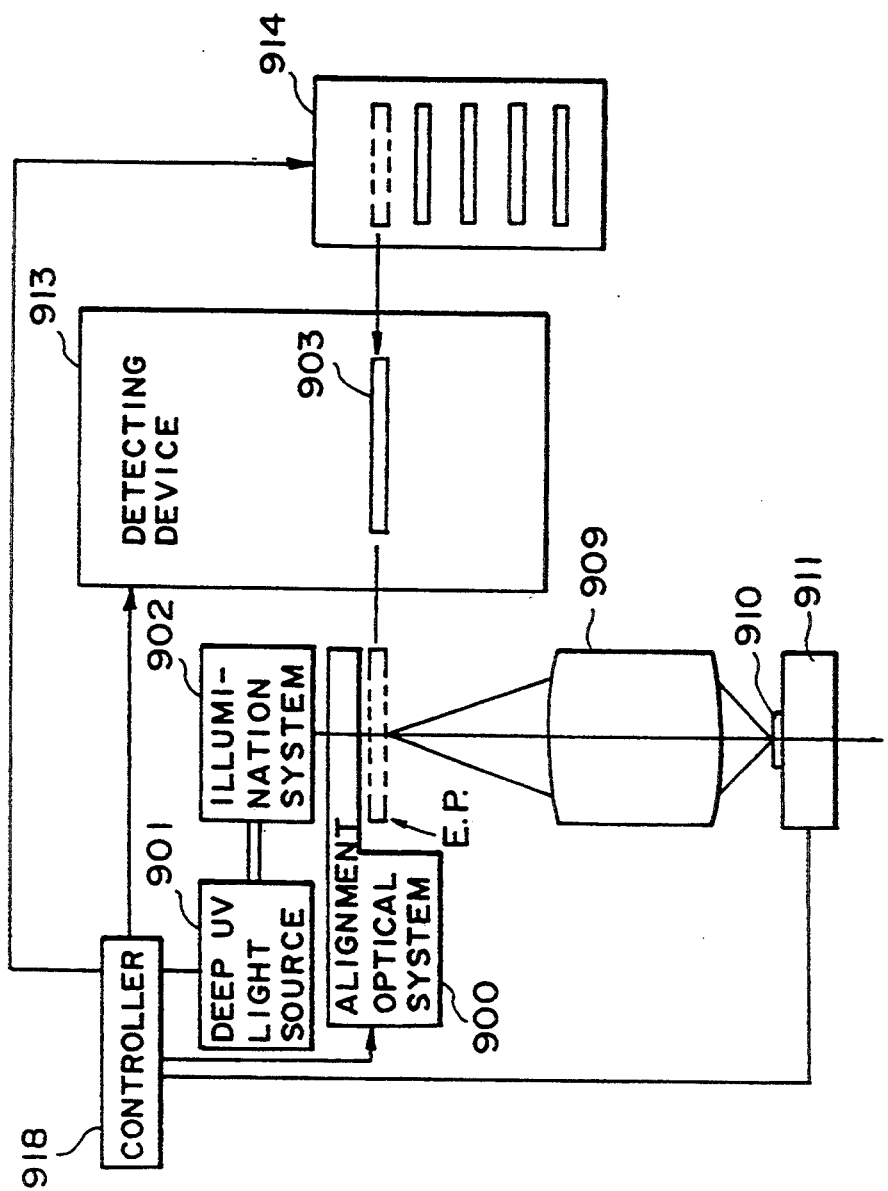
FIG. 12 illustrates a manufacturing system for manufacturing a semiconductor device.

FIG. 12 shows an embodiment of a semiconductor device manufacturing system for printing a circuit pattern of an original such as a reticle or photomask on a silicon wafer. Generally, it comprises an exposure apparatus (of the type as described hereinbefore), an original storing device, an original inspecting device and a controller, all being placed in a clean room.

Denoted at 901 is a deep UV light source such as an excimer laser. Denoted at 902 is an illumination system unit having a structure for changing the shape of illumination light source in accordance with a circuit pattern, as described hereinbefore. It serves to illuminate an original, placed at the exposure position EP at once from the above, with a suitable NA (numerical aperture). Denoted at 909 is a projection optical system for transferring the circuit pattern of the original onto a silicon wafer 910. It comprises an ultra-high resolution lens system (or mirror system). During the printing operation, zones of the wafer are exposed sequentially while the wafer is moved stepwise by the stepwise motion of a movable stage 911. Denoted at 900 is an alignment optical system for aligning the original and the wafer prior to the exposure operation. It comprises at least one original observing microscope system. The exposure apparatus is composed of those elements described above.

On the other hand, denoted at 914 is the original storing device for storing plural originals therein. Denoted at 913 is the original inspecting device for inspecting presence of any foreign particle or the like on an selected original taken out of the original storing device, before it is placed at the exposure position EP. The controller 918 is provided to control the sequence of the system as a whole. Particularly, it serves to control the operation of the original storing device 914 and the original inspecting device 913, as well as the alignment and exposure operation and the wafer stepwise feeding operation which are basic operations of the exposure apparatus.

The semiconductor device manufacturing process using the system of this embodiment will be explained.

First, an original to be used is off-loaded out of the original storing device 914. Then, it is placed in the inspecting device 913 and the inspection of any foreign particle or the like on the original is effected. If absence of such foreign particle is discriminated by the inspection, the original is then placed at the exposure station EP. Subsequently, a silicon wafer 910 which is the object to be exposed is placed on the movable stage 911. Then, while moving the wafer stepwise through stepwise motion of the movable stage 911, the pattern of the original is printed by reduction projection exposure onto the zones of the wafer sequentially. After exposure of one wafer is completed, the exposed wafer is off-loaded and another wafer is supplied, and a similar step-and-repeat exposure operation is made to this wafer.

Exposed silicon wafer is fed into separate processing devices wherein a developing process, an etching process and so on are executed. Subsequently, the processed wafer is subjected to a dicing process, a wire bonding process, a packaging process and so on, whereby semiconductor devices are manufactured.

Embodiment 4

Next, an embodiment of semiconductor device manufacturing method using the exposure apparatus described above will be explained.

FIG. 13 is a flow chart of the sequence of manufacturing a semiconductor device such as a semiconductor chip (e.g. IC or LSI), a liquid crystal panel or a CCD, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the wafer. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out. With these processes, semiconductor devices are finished and they are shipped (step 7).

Figure 14:
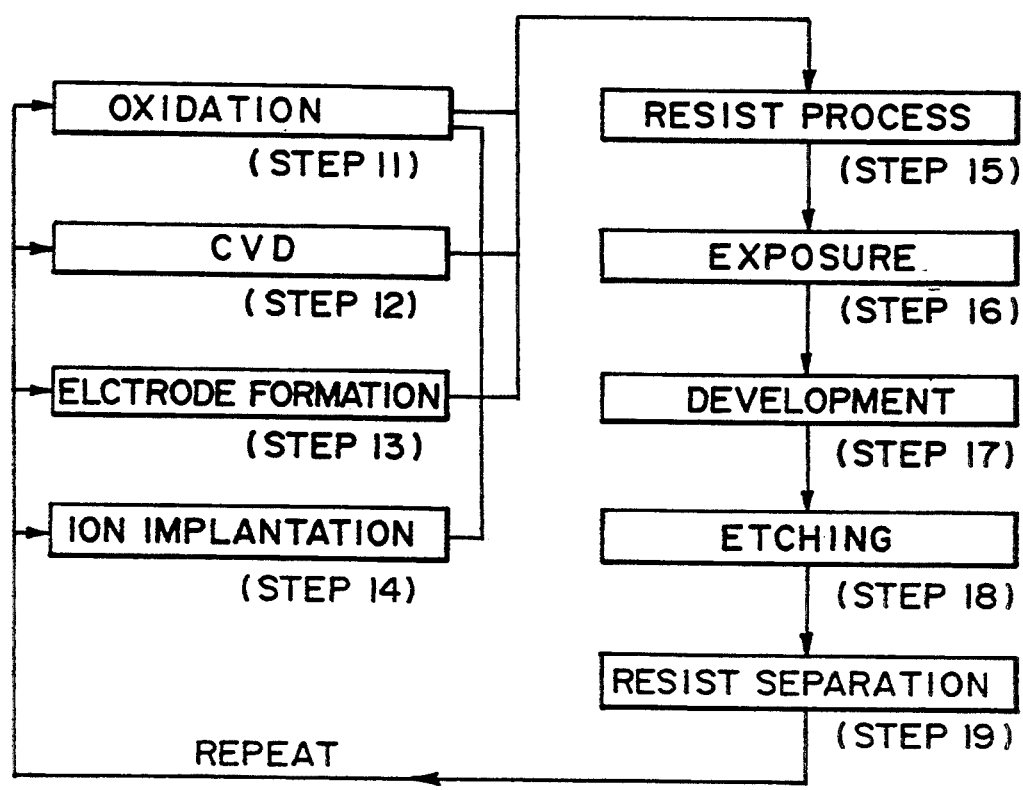
FIG. 14 is a flow chart of a wafer process.

FIG. 14 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. A semiconductor device manufacturing system, comprising:

inspection means for inspecting an original having a device pattern;

projection exposure device for transferring the device pattern of the original having been inspected by said inspecting means, onto a wafer, said projection exposure device comprising an illumination optical system for forming illumination source for illuminating the original, said illumination optical system including a changing mechanism for changing a shape of the illumination source, said device further comprising a projection optical system for transferring an image of the pattern onto the wafer and adjusting means for adjusting said projection optical system in response to said changing mechanism.

2. A semiconductor device manufacturing system, comprising:

inspection means for inspecting an original having a device pattern;

projection exposure device for transferring the device pattern of the original having been inspected by said inspecting means, onto a wafer, said projection exposure device comprising an illumination optical system for forming illumination source for illuminating the original, said illumination optical system including a changing mechanism for changing a shape of the illumination source, said device further comprising a projection optical system for transferring an image of the pattern onto the wafer and processing means for calculating an optical property of said projection optical system using a parameter changed in accordance with the change of the shape of the illumination system.

preparing a wafer and an original having a device pattern;

selecting the shape of an illumination source for illuminating the original in accordance with the nature of the pattern;

adjusting a projection optical system in accordance with the selected shape;

transferring the pattern of the original illuminated by the illumination source, onto the wafer through the projection optical system; and inspecting the original.

4. A device manufacturing method comprising the steps of:

preparing a wafer and an original having a device pattern;

selecting the shape of an illumination source for illuminating the original in accordance with the nature of the device pattern;

calculating an optical property of a projection optical system by using a parameter in accordance with the selected shape;

transferring the device pattern of the original illuminated by the illumination source, onto the wafer through the projection optical system; and inspecting the original.

5. A projection exposure method, comprising the steps of:

determining the shape of an illumination source for illuminating an original having an exposure pattern, in accordance with the exposure pattern;

exposing the surface to be exposed with an image of the exposure pattern illuminated by the illumination source, through a projection optical system; and calculating an optical property of the projection optical system, other than the focal point and the projection magnification, by using a parameter corresponding to the determined shape of the illumination source.

6. A device manufacturing system, comprising:

inspection means for inspecting an original having a device pattern;

a projection exposure device for transferring the circuit pattern of the original having been inspected by said inspecting means, onto a wafer, said projection exposure device including an illumination optical system for forming an illumination source for illuminating the original, said illumination optical system including a changing mechanism for changing the shape of the illumination source, said projection exposure device further including a projection optical system for transferring an image of the device pattern of the original onto the wafer and processing means for calculating an optical property of said projection optical system, other than the focal point and the projection magnification thereof, by using a parameter changed in accordance with the change of the shape of the illumination source.

7. A device manufacturing method, comprising the steps of:

preparing a wafer and a device pattern;

selecting the shape of an illumination source for illuminating the original in accordance with the nature of the pattern;

calculating an optical property of a projection optical system, other than the focal point and the projection magnification thereof, by using a parameter in accordance with the selected shape; and transferring the device pattern illuminated by the illumination source, onto the wafer through the projection optical system.

8. A method according to claim 7, further comprising the step of inspecting the original.

9. A device manufactured by:

preparing a wafer and an original having a device pattern;

selecting the shape of an illumination source for illuminating the original in accordance with the nature of the device pattern;

calculating an optical property of a projection optical system, other than the focal point and the projection magnification thereof, by using a parameter in accordance with the selected shape; and transferring the device pattern of the original illuminated by the illumination source, onto the wafer through the projection optical system.

10. A device manufacturing system, comprising:

inspecting means for inspecting a surface condition of an original having a device pattern; and projection exposure means for transferring the device pattern of the inspected original onto a substrate, wherein said projection exposure means includes (i) means for providing an illumination source for illuminating the original and for changing a shape of the illumination source, (ii) a projection optical system for projecting an image of the device pattern of the original onto the substrate, and (iii) means for adjusting said projection optical system in accordance with the shape of the illumination source.

11. A device manufacturing system, comprising:

inspecting means for inspecting a surface condition of an original having a device pattern thereon; and projection exposure means for transferring the device pattern of the inspected original onto a substrate, wherein said projection exposure means includes (i) means for providing an illumination source for illuminating the original and for changing a shape of the illumination source, (ii) a projection optical system for projecting an image of the device pattern of the original onto the substrate, and (iii) means for calculating a change in an optical property of said projection optical system, using a parameter corresponding to the shape of the illumination source and for adjusting said projection optical system to compensate for the change of the optical property.

12. A system according to claim 11, wherein said calculating means calculates a change in the projection magnification of said projection optical system.

13. A system according to claim 11, wherein said calculating means calculates a change in the imaging position of the image.

14. A system according to claim 13, wherein said calculating means also calculates a change in the projection magnification of said projection optical system.

15. A device manufacturing method, comprising the steps of:

providing a workpiece and a device pattern;

changing a shape of an illumination source for illuminating the device pattern;

adjusting a projection optical system in accordance with the changed illumination source;

illuminating the device pattern with the changed illumination source so as to transfer the illuminated device pattern onto the workpiece through the adjusted projection optical system; and inspecting a surface condition of the device pattern prior to the transfer of the device pattern to the workpiece.

16. A device manufacturing method, comprising the steps of:

providing a workpiece and a device pattern;

changing a shape of an illumination source for illuminating the device pattern;

calculating a change in an optical property of a projection optical system, using a parameter corresponding to the changed illumination source;

adjusting the projection optical system to compensate for the change in the optical property;

illuminating the device pattern with the changed illumination source so as to transfer the illuminated device pattern onto the workpiece through the adjusted projection optical system; and inspecting a surface condition of the device pattern prior to the transfer of the device pattern to the workpiece.

17. A projection exposure method, comprising the steps of:

changing a shape of an illumination source for illuminating an original;

calculating a change in an optical property of a projection optical system other than an imaging position and a projection magnification, while using a parameter corresponding to the changed illumination source;

adjusting the projection optical system to compensate for the change in the optical property; and exposing a surface to be exposed, with an image of the original illuminated by the changed illumination source, through the adjusted projection optical system.

18. A device manufacturing system, comprising:

inspecting means for inspecting a surface condition of an original having a device pattern; and projection exposure means for transferring the device pattern of the inspected original onto a substrate, wherein said projection exposure means includes (i) means for providing an illumination source for illuminating the original and for changing a shape of said illumination source, (ii) a projection optical system for projecting an image of the device pattern of the original onto the substrate, and (iii) means for calculating a change in an optical property of said projection optical system other than an imaging position and a projection magnification, which using a parameter corresponding to the shape of said illumination source, said calculating means further being operable to adjust said projection optical system to compensate for the change in the optical property.

19. A device manufacturing method, comprising the steps of:

providing a workpiece and a device pattern;

changing a shape of an illumination source for illuminating the device pattern;

calculating a change in an optical property of a projection optical system other than an imaging position and a projection magnification, while using a parameter corresponding to the changed illumination source;

adjusting the projection optical system to compensate for the change in the optical property; and illuminating the device pattern with the changed illumination source so as to transfer the device pattern onto the workpiece through the adjusted projection optical system.

20. A method according to claim 19, further comprising the step of inspecting a surface condition of the device pattern prior to the transfer of the device pattern to the workpiece.

21. A device manufactured in accordance with a method which includes the steps of:

providing a workpiece and a device pattern;

changing a shape of an illumination source for illuminating the device pattern;

calculating a change in an optical property of a projection optical system other than an imaging position and a projection magnification while using a parameter corresponding to the changed illumination source;

adjusting the projection optical system to compensate for the change in the optical property; and illuminating the device pattern with the changed illumination source so as to transfer the device pattern onto the workpiece through the adjusted projection optical system.

22. A projection exposure method, comprising the steps of:

changing a shape of an illumination source for illuminating an original;

adjusting an aberration of a projection optical system in accordance with the changed illumination source; and exposing a surface to be exposed, with an image of the original illuminated by the changed illumination source, through the adjusted projection optical system.

23. A method according to claim 22 wherein said adjusting step includes the step of adjusting the field of curvature of the projection optical system.

24. A method according to claims 22 or 23, wherein said adjusting step includes the step of adjusting the distortion of the image of the original.

25. A projection exposure method, comprising the steps of:

changing a shape of an illumination source for illuminating an original;

adjusting the one side blurness of a projection optical system in accordance with the changed illumination source; and exposing a surface to be exposed, with an image of the original illuminated by the changed illumination source, through the adjusted projection optical system.

26. A projection exposure method, comprising the steps of:

changing a shape of an illumination source for illuminating an original;

adjusting the pivotal inclination of a projection optical system in accordance with the changed illumination source; and exposing a surface to be exposed, with an image of the original illuminated by the changed illumination source, through the adjusted projection optical system.

27. A device manufacturing system, comprising:

inspecting means for inspecting a surface condition of an original having a device pattern; and projection exposure means for transferring the device pattern of the inspected original onto a substrate, wherein said projection exposure means includes (i) means for providing an illumination source for illuminating the original and for changing a shape of said illumination source, (ii) a projection optical system for projecting an image of the device pattern of the original onto the substrate, and (iii) means for adjusting an aberration of the projection optical system in accordance with the shape of said illumination source.

28. A system according to claim 27 wherein the aberration includes the field of curvature of the projection optical system.

29. A system according to claims 27 or 28, wherein the aberration includes distortion of the image of the original.

30. A device manufacturing system, comprising:

inspecting means for inspecting a surface condition of an original having a device pattern; and projection exposure means for transferring the device pattern of the inspected original onto a substrate, wherein said projection exposure means includes (i) means for providing an illumination source for illuminating the original and for changing a shape of said illumination source, (ii) a projection optical system for projecting an image of the device pattern of the original onto the substrate, and (iii)

means for adjusting the one side blurness of said projection optical system in accordance with the shape of said illumination source.

31. A device manufacturing system, comprising:
inspecting means for inspecting a surface condition of an original having a device pattern; and
projection exposure means for transferring the device pattern of the inspected original onto a substrate,
wherein said projection exposure means includes (i) means for providing an illumination source for illuminating the original and for changing a shape of said illumination source, (ii) a projection optical system for projecting an image of the device pattern of the original onto the substrate, and (iii) means for adjusting the pivotal inclination of said projection optical system in accordance with the shape of said illumination source.

32. A device manufacturing method, comprising the steps of:
providing a workpiece and a device pattern;
changing a shape of an illumination source for illuminating the device pattern;
adjusting an aberration of a projection optical system in accordance with the changed illumination source; and
illuminating the device pattern with the changed illumination source so as to transfer the device pattern onto the workpiece through the adjusted projection optical system.

33. A method according to claim 32, wherein the aberration includes the field of curvature of the projection optical system.

34. A method according to claim 32 or 33 wherein said adjusting step includes the step of adjusting the distortion of the image of the original.

35. A device manufacturing method, comprising the steps of:
providing a workpiece and a device pattern;
changing a shape of an illumination source for illuminating the device pattern;
adjusting the one side blurness of a projection optical system in accordance with the changed illumination source; and
illuminating the device pattern with the changed illumination source so as to transfer the device pattern onto the workpiece through the adjusted projection optical system.

36. A device manufacturing method, comprising the steps of:
providing a workpiece and a device pattern;
changing a shape of an illumination source for illuminating the device pattern;
adjusting the pivotal inclination of a projection optical system in accordance with the changed illumination source; and
illuminating the device pattern with the changed illumination source so as to transfer the device pattern onto the workpiece through the adjusted projection optical system.

37. A device manufactured in accordance with a method which includes the steps of:
providing a workpiece and a device pattern;
changing a shape of an illumination source for illuminating the device pattern;
adjusting an aberration of a projection optical system in accordance with the changed illumination source; and
illuminating the device pattern with the changed illumination source so as to transfer the device pattern onto the workpiece through the adjusted projection optical system.

38. A device according to claim 37, wherein the aberration includes the field of curvature of the projection optical system.

39. A device according to claim 36 or 37, wherein the aberration includes distortion of the image of the original.

40. A device manufactured in accordance with a method which includes the steps of:
providing a workpiece and a device pattern;
changing a shape of an illumination source for illuminating the device pattern;
adjusting the one side blurness of a projection optical system in accordance with the changed illumination source; and
illuminating the device pattern with the changed illumination source so as to transfer the device pattern onto the workpiece through the adjusted projection optical system.

41. A device manufactured in accordance with a method which includes the steps of:
providing a workpiece and a device pattern;
changing a shape of an illumination source for illuminating the device pattern;
adjusting the pivotal inclination of a projection optical system in accordance with the changed illumination source; and
illuminating the device pattern with the changed illumination source so as to transfer the device pattern onto the workpiece through the adjusted projection optical system.

* * * * *

UNITED STATES PATENT AND TRADEMARK OFFICE
CERTIFICATE OF CORRECTION

PATENT NO. : 5,424,803
DATED : June 13, 1995
INVENTOR(S) : MIYOKO NOGUCHI

It is certified that error appears in the above-indentified patent and that said Letters Patent is hereby corrected as shown below:

ON THE COVER PAGE

[56] References Cited

FOREIGN PATENT DOCUMENTS

"4267515 9/1992 Japan" should read --4-267515 9/1992 Japan--.

ON SHEET 13 OF THE DRAWINGS

In Fig. 14, "ELCTRODE" in step 13 should read --ELECTRODE--.

COLUMN 1

Line 28, delete "a".
Line 38, "reversely" should read --inversely--.

COLUMN 2

Line 30, "ultra high" should read --ultra-high--.

COLUMN 3

Line 42, "wit" should read --with--.

COLUMN 4

Line 48, "leases" should read --lenses--.
Line 52, "come." should read --comes.--.

COLUMN 5

Line 57, "be-used" should read --be used--.

UNITED STATES PATENT AND TRADEMARK OFFICE
CERTIFICATE OF CORRECTION

PATENT NO. : 5,424,803

DATED : June 13, 1995

INVENTOR(S) : MIYOKO NOGUCHI

It is certified that error appears in the above-indentified patent and that said Letters Patent is hereby corrected as shown below:

COLUMN 6

Lines 3 and 5, "having" should read --has--.
    Line 67, "a" (second occurrence) should read --all--.

COLUMN 7

Line 14, "comprise" should read --comprises--.
    Line 46, "coefficient." should read --coefficients.--.
    Line 48, "the" (first occurrence) should read --and the--.
    Line 50, "coefficient" should read --coefficients--.
    Line 51, "coefficient." should read --coefficients.--.

COLUMN 8

Line 13, "Where" should read --where--.
    Line 14, "time. The" should read --time, and the--.

UNITED STATES PATENT AND TRADEMARK OFFICE
CERTIFICATE OF CORRECTION

PATENT NO. : 5,424,803
DATED : June 13, 1995
INVENTOR(S) : MIYOKO NOGUCHI

It is certified that error appears in the above-indentified patent and that said Letters Patent is hereby corrected as shown below:

COLUMN 10

Line 9, "have" should read --has--.

COLUMN 11

Line 3, "give" should read --gives--.
Line 5, "($\Delta$S)," should read --($\Delta\beta$),--.
Line 30, "TABLE 3" should read --TABLE 3 (continued)--.
Table 3, Line 33, "$\Delta$Y" should read --$\Delta$y--.
Line 48, "between lens" should read --between-lens--.
Line 52, "as" should read --of--.

COLUMN 12

Line 14, "$\Delta$B," should read --$\Delta\beta$--.
Line 15, "$\Delta$B," should read --$\Delta$P--.
Line 25, "$\Delta$B=" should read --$\Delta\beta$=--.
Line 35, "$\Delta Sd=$" should read --$\Delta$SD=--.
Line 43, "$\Delta$B" should read --$\Delta\beta$--.
Line 52, "$\Delta$B=" should read --$\Delta\beta$=--.
Line 61, "$\Delta$Sd=" should read --$\Delta$SD=--.
Line 67, "$\Delta$B," should read --$\Delta\beta$,--.

UNITED STATES PATENT AND TRADEMARK OFFICE
CERTIFICATE OF CORRECTION

PATENT NO. : 5,424,803
DATED : June 13, 1995
INVENTOR(S) : MIYOKO NOGUCHI

It is certified that error appears in the above-indentified patent and that said Letters Patent is hereby corrected as shown below:

COLUMN 13

Line 21, "$\Delta B$" should read --$\Delta \beta$--.

COLUMN 14

Line 57, "an" should read --a--.

COLUMN 16

Line 6, "semiconductor" should be deleted.
Line 23, "semiconductor" should be deleted.
Between Lines 51 and 52, insert
--3. A device manufacturing method, comprising the steps of:
preparing a wafer and an original having a device pattern;
selecting the shape of an illumination source for illuminating the original in accordance with the nature of the pattern;
adjusting a projection optical system in accordance with the selected shape;
transferring the pattern of the original illuminated by the illumination source, onto the wafer through the projection optical system; and
inspecting the original.--.

UNITED STATES PATENT AND TRADEMARK OFFICE
CERTIFICATE OF CORRECTION

PATENT NO. : 5,424,803
DATED : June 13, 1995
INVENTOR(S) : MIYOKO NOGUCHI

It is certified that error appears in the above-indentified patent and that said Letters Patent is hereby corrected as shown below:

COLUMN 17

Line 17, "circuit" should read --device--.

Signed and Sealed this

Twenty-fourth Day of October, 1995

Attest:

BRUCE LEHMAN

*Attesting Officer*  *Commissioner of Patents and Trademarks*